United States Patent [19]

Bond et al.

[11] 4,450,559

[45] May 22, 1984

[54] MEMORY SYSTEM WITH SELECTIVE ASSIGNMENT OF SPARE LOCATIONS

[75] Inventors: George L. Bond, Fishkill; Akella V. S. Satya, Wappingers Falls, both of N.Y.

[73] Assignee: International Business Machines Corporation, Armonk, N.Y.

[21] Appl. No.: 334,343

[22] Filed: Dec. 24, 1981

[51] Int. Cl.³ .................... G06F 11/20; G11C 29/00
[52] U.S. Cl. ........................... 371/10; 364/200; 364/900; 365/200
[58] Field of Search .................. 371/51, 2, 38, 10; 365/200; 364/200 MS File, 900 MS File

[56] References Cited

U.S. PATENT DOCUMENTS

| | | | |
|---|---|---|---|
| 3,331,058 | 7/1967 | Perkins, Jr. | 364/900 |
| 3,436,734 | 4/1969 | Pomerene et al. | 364/200 |
| 3,633,175 | 1/1972 | Harper | 371/10 X |
| 3,999,051 | 12/1976 | Petschauer | 371/10 |
| 4,006,467 | 2/1977 | Bowman | 371/38 X |
| 4,051,460 | 9/1977 | Yamada et al. | 364/900 |
| 4,093,985 | 6/1978 | Das | 364/200 |
| 4,150,428 | 4/1979 | Inrig et al. | 364/200 |
| 4,375,664 | 3/1983 | Kim | 371/38 X |
| 4,394,763 | 7/1983 | Nagano et al. | 371/38 |

OTHER PUBLICATIONS

Bossen, D. C. et al., "Measurement and Generation of Error Correcting Codes for Package Failure", *IEEE Transactions on Computers*, vol. C-27, No. 3, Mar. 1978, pp. 201-204.

*Primary Examiner*—Charles E. Atkinson
*Assistant Examiner*—Clark A. Jablon
*Attorney, Agent, or Firm*—R. E. Cummins

[57] ABSTRACT

A memory system is provided with a simple flexible control arrangement for assigning locations in an alternate memory as replacements for previously identified defective fault areas in main memory. The assignment of the replacement locations in the alternate memory is made on a selective basis taking into consideration the defect status of other failure independent bit positions of a data word and the power of the ECC code which is used in connection with the memory system. A relatively small writable index, which is addressed by a subset of the main memory address signals, provides a partial address and control fields to the alternate memory in accordance with control data transferred from the host system. Control data is developed by the host system each time it is powered on and is based on identifying each defective location in main memory through a diagnostic routine and analyzing the defect distribution in a way to provide control signals which minimize the number of replacements that are assigned and maximize the number of data words that can be transferred from the memory system to the host system before an uncorrectable error is encountered by the ECC system.

11 Claims, 9 Drawing Figures

MEMORY SYSTEM WITH SELECTIVE ASSIGNMENT OF SPARE LOCATIONS

DESCRIPTION

1. Background of the Invention

This invention relates in general to digital data memory systems in which defective storage locations are logically replaced by storage locations in alternate memory units. The invention relates in particular to a memory system in which defective storage locations in the main memory are selectively replaced to minimize the number of assigned auxiliary storage locations in the alternate memory and maximize the amount of data that can be read from the memory before encountering an error type that is uncorrectable by an associated error correcting system.

2. Description of Prior Art

The prior art has disclosed various memory systems which enable a memory unit that has a number of known defective storage locations to be employed as a usable storage device. Examples of this art include U.S. Pat. No. 3,436,734 and U.S. Pat. No. 3,331,058.

In one simple prior art arrangement, the memory address means is arranged such that any addressable storage location which contains a defect is merely bypassed. In other prior art arrangements, an auxiliary memory is employed to store data that would normally be stored at a location in the main memory that contained a defect. Suitable circuitry is then provided to recognize when a defect location is being addressed so that the data being entered can be stored in the auxiliary memory or, if data is being read from memory, the data from the auxiliary memory is provided in place of data from the main memory.

The prior art has also long recognized that data being stored in the memory can be protected against errors by a suitable error correcting system wherein check characters are generated as the data is being entered into the memory and are then stored with the data so that when the data is subsequently read out and check characters are again generated, the system can detect the presence of errors, the type of error, and the location of the error by processing the various check characters so that the error can then be corrected before the data is further processed by the system.

The number of check characters that are associated with the word of data that is stored in memory depends on the power of the ECC code employed. Generally, however, as the number of error types that have to be corrected increases, so do the number of check characters that have to be generated and stored with the data word.

It is, of course, desirable to employ an ECC system which uses a minimum number of check bits or check characters since they occupy positions in the main memory and decrease the data storage efficiency of the system. It is also, of course, desirable to minimize the number of auxiliary storage locations that have to be provided as replacements for defective locations of a given main memory. It is also desirable to use as many main memory units as possible, even though the unit has some defective locations, thereby increasing the yield factor and reducing the costs.

SUMMARY OF THE INVENTION

The present invention provides a memory system using a main memory with defective storage locations which permits each system to be optimized in accordance with the number and location of defective positions of the main memory by providing means for selectively controlling which defective locations of the main memory unit are logically replaced with good locations in an auxiliary memory so the reading of a data word into the system from that location with an uncorrectable error is avoided.

It is, therefore, an object of the present invention to provide a memory system for storing data in which a minimum amount of auxiliary storage is required to store data that cannot be stored in defective locations of the main memory.

It is a further object of the present invention to provide a memory system which is characterized by means for selectively assigning replacement storage positions in an auxiliary memory in accordance with the pattern of defective storage locations in the main memory and the error patterns that are correctable by an associated error correcting system.

A still further object of the present invention is to provide a memory system in which defective locations in main memory are replaced on a logical basis without impacting system performance.

Another object is to provide a memory system in which defective locations in main memory are mapped to good spare locations in an alternate memory by means of a relatively small index.

The foregoing and other objects, features, and advantages of the invention will be apparent from the following more particular description of a preferred embodiment of the invention as illustrated in the accompanying drawings.

DESCRIPTION OF THE PREFERRED EMBODIMENT

Figure 1:
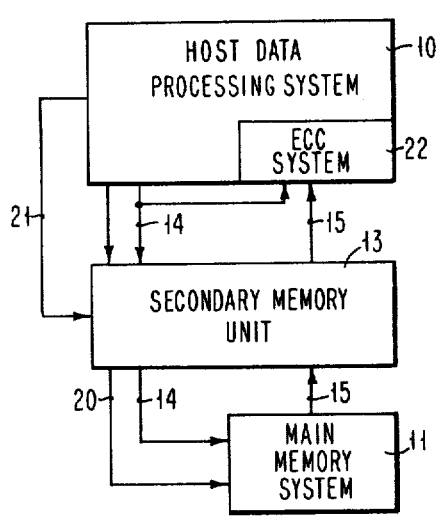
FIG. 1 is a functional block diagram of a data processing system embodying a memory system arranged in accordance with the present invention.

The data processing system shown in FIG. 1 comprises a host data processing CPU 10, a main memory system 11, and a secondary memory 13 which is connected between CPU 10 and memory system 11. As shown in FIG. 1, a data bus 14 extends from the CPU 10 into the system 11 through the secondary unit 13. Similarly, an input data bus 15 extends from the main data storage system 11 to the CPU 10 through the unit 13. Address bus 20 also extends from the CPU 10 to the main data storage system 11 and to the unit 13. A control bus 21 provides control data to the unit 13 from the CPU 10. An error correcting system 22 is associated with the input bus 15 and output bus 14 and functions to generate error correcting check characters for each data word transferred from the CPU 10 to system 11 and transferred from the system 11 over the output bus 15 to the CPU 10. The ECC system 22 functions to correct predetermined types of errors which result either from defective storage locations being involved in the transfer or a random error occurring for any number of valid technical reasons.

Figure 2:
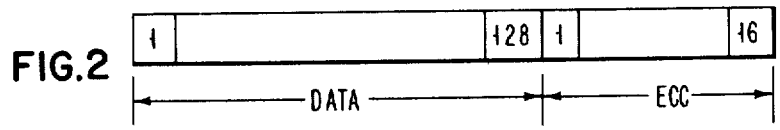
FIG. 2 illustrates one example of the format of a data word that may be handled by the system shown in FIG. 1.
Figure 4:
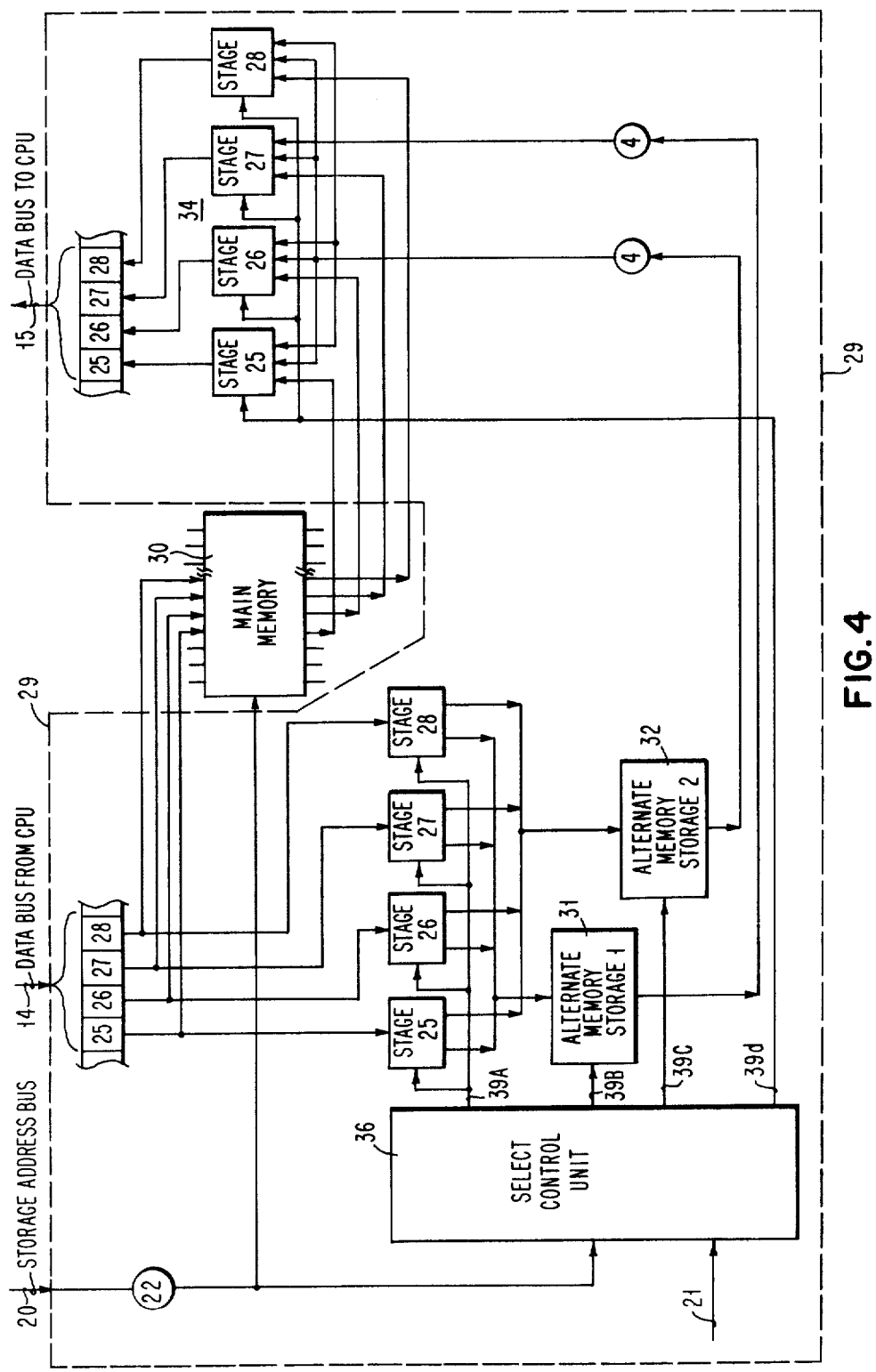
FIG. 4 is a block diagram of a replacement unit for the memory system shown in FIG. 1.

The embodiment of the invention to be described involves data words having 144 bit positions, as shown in FIG. 2, which comprise 128 data bit positions and 16 check bit positions. The data busses 14 and 15 are assumed to be 144 bits wide, as shown in FIGS. 1 and 4. It is further assumed that the storage system 11 stores $64^2K$ ($K=1,024$) data words and that each bit of a data word is stored at a failure independent bit cell location relative to the other 143 bits.

Figure 1A:
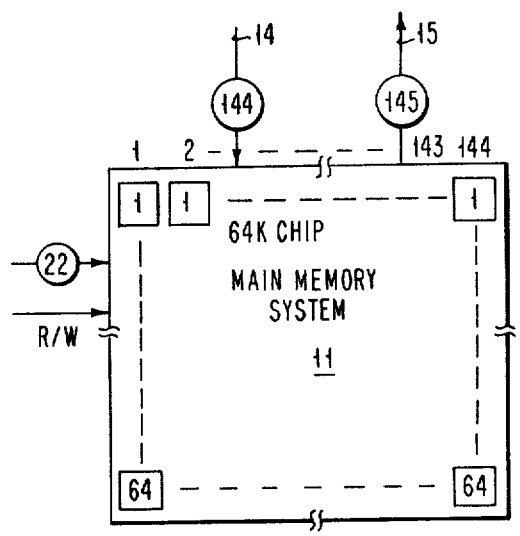
FIG. 1a illustrates the chip organization of the main memory shown in FIG. 1.
Figure 3A:
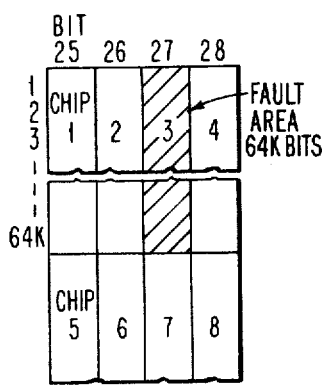
FIGS. 3a–3c illustrate various possible defect patterns of the main memory shown in FIG. 1.
Figure 3B:
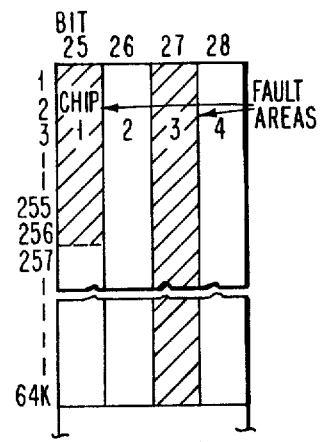
Figure 3C:
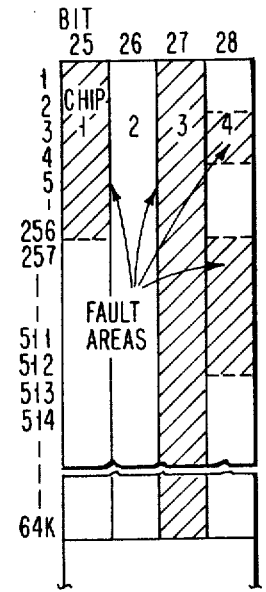

The main data storage system 11 comprises a main memory 30 which is shown in FIG. 1a and which consists of an array of 64 chips for each bit position of the 144-bit word shown in FIG. 2, with each chip containing 64K bit cells. The memory, therefore, stores $64^2K$ data words of 144 bits each. The storage address bus 20 is 22 bits wide to define one of $64^2K$ word locations. The main memory is susceptible to various errors, some of which are represented in FIGS. 3a–3c. In FIG. 3a, one chip of 64K bit cells is defective. It is associated with bit position 27. In FIG. 3b, one row of chip 1, associated with bit position 25, is shown as defective, making 256 contiguous addresses defective. FIG. 3c shows a smaller defect area in chip 4 associated with bit position 28 at bit cell positions 3 and 4, and also at a defective column at bit cell locations 257–512.

The portion of FIG. 4 within the dotted box 29 is one of 36 identical alternate data storage sections also referred to as replacement units. Each section comprises two alternate memories 31 and 32. A write multiplexer 33 is disposed between four lines of the output bus 14 from the CPU 10 and alternate memories 31 and 32. Output multiplexer 34 is connected between the outputs of the main memory 30 and alternate memories 31 and 32 and four lines of the input bus 15 to the CPU 10. The address bus 20 is connected to the main data storage unit 30 and to the selection control unit 36 which also receives the control bus 21 from the CPU 10. Output control lines 39A–39D from block 36 extend to both alternate memories 31 and 32 and both multiplexers 33 and 34. The selection control block 36 functions generally to address locations in the alternate memory units 31 and 32 to replace defective bit cells in the main memory 30.

It has been assumed that the main memory 30 consists of 144 separate memory arrays of 64 chips which are arranged such that a data word consisting of 144 bit positions is stored in a manner that each bit is failure independent of all the other bits. In other words, if one 64K chip of an array of 64 chips becomes totally inoperative, only one bit in each word stored at the 64K addressed locations will be affected and the defective chip may be entirely replaced by another 64K chip in one of the alternate storage units 31 or 32.

In such an arrangement, a 16-bit address supplied to each chip functions to select the same bit cell on each chip. For purposes of explanation, the chip may be envisioned as comprising a matrix of 256 rows and 256 columns such that an 8-bit byte defines one of 256 rows and another 8-bit byte defines one of 256 columns and together the 16 bits define one bit cell at the intersection of a row and a column. An additional 6 bits are required to select one of the 64 chips associated with each bit position of the data word. The address bus 20 shown in FIGS. 1 and 4, therefore, consists of 22 bits. Input data bus 14 extending from the CPU 10 is 144 bits wide, as is the output bus 15 to the CPU 10. The input and output multiplexers 33 and 34 of each section are 4 bits wide, as are the various busses which extend between the unit's main memory 30 and the alternate memories 31 and 32. As mentioned previously, there are 36 identical replacement units 29 similar to that shown in FIG. 4 so that the input and output busses 14 and 15 may be considered as being made up of 36 groups of 4 bit lines each.

Under normal operation, a 144-bit word is transferred into main memory 30 by input bus 14 and stored at the location defined by the 22-bit address supplied on address bus 20. The transfer of data from main storage 30 is accomplished by again supplying the 22-bit address on address bus 20 which transfers the 144 data bits through the output multiplexers 34 of each replacement unit 29 to the output bus 15.

In summary, 6 bits of the address are used to select one of 64 chips, while 16 bits of the address actually address the same cell in each of the selected 144 chips. On the assumption that the addressed location in main memory was not indicated as including a defective cell location that should be replaced, none of the alternate memories of the 36 separate replacement units 29 need to be activated.

A Replacement Unit

Figure 6:
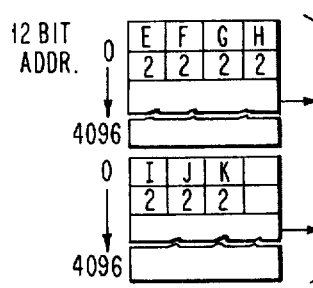
FIG. 6 illustrates one example of the contents of the index shown in FIG. 5.
Figure 5:
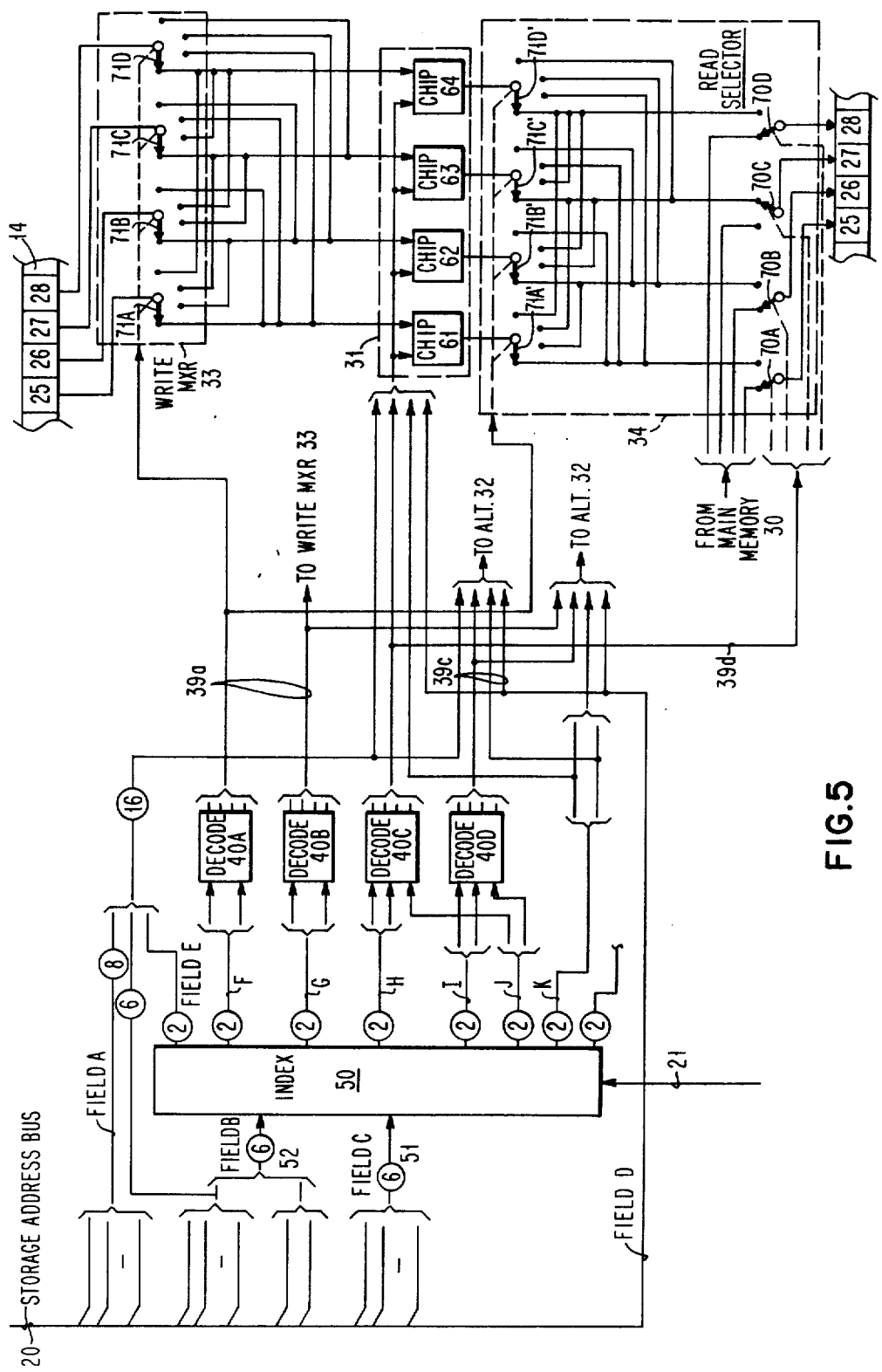
FIG. 5 is a detailed functional block diagram of the unit shown in FIG. 4.

The details of a typical replacement unit will now be described. As shown in FIG. 5, the selection unit 36 of FIG. 4 comprises an index unit 50 which is provided with two input address busses 51 and 52 and the control input bus 21 from the CPU 10. Input busses 51 and 52 are each 6-bit busses which are derived from a part of the 22-bit address from data bus 20 that is used to address a location in the main memory 30. The function of the index unit 50 is to generate an address for the alternate storage units 31 and 32 and to provide control type signals to the section which define the operation or control mode of each replacement unit 29. The index 50 of each replacement unit, therefore, comprises a writable memory that can store a portion of the address data and the control data. The size of the index unit will be dependent on various parameters, such as the size of the main memory, the reliability, the amount of defects in the main memory, and the size of the defects to be replaced. In the described embodiment, it will be assumed that the minimum replacement of a defective storage area will be 1,048 bit cells or a group of 4 columns of a chip. The index may, therefore, consist of two 4K×8 memory modules. Each of the memory modules is supplied with a 12-bit address to provide a 16-bit output from the index 50. Therefore, the input busses 51 and 52 to the index 50 are 6 bits each, while the output provided from the index is 16 bits, 14 of which are used for the various fields which are shown in FIG. 6, including field E, which becomes part of the address for the alternate memories 31 and 32.

The alternate data storage unit 31 shown in FIG. 5 has four chips. Units 31 and 32 provide the replacement spares for bit positions 25–28 of the data word and can be used to replace various fault areas in main memory chips associated with bit positions 25–28.

The location of the defective memory cells are supplied to the index 50 from the CPU 10 over the control signal bus 21 and, as will be explained later, does not necessarily include all defective cell locations of any size in the main memory. Only information on the defective cells in main memory 30 for which spare areas in the alternate data storage units 31 and 32 are provided are stored in the index. Storage locations in index 50 associated with non-defective cells of the main memory are also supplied with data from the CPU. This data causes the replacement section to not operate when those locations are addressed. In accordance with the underlying concept of the present invention, some defective storage locations in main memory will not be replaced by corresponding locations in the alternate memory units 31 and 32 since the system will rely on the ECC system to insure the validity of any data read from defective cells that are not replaced. The choice of what cells to be replaced is done in the CPU on a logical algorithmic basis involving knowledge of the error correcting power of the ECC system, the nature of the data being stored, the probability of random errors occurring in a data word, the consequences of an undetected error and/or uncorrectable error being supplied to the host system, and an up-to-date analysis of the defect distribution pattern of each data word location.

The data that is stored in the index is supplied by the CPU which has been programmed to perform a memory check and identify cells which are defective. The defect may be a result of a manufacturing error or one which occurred subsequently in the field.

In the embodiment shown in the drawing, the storage address bus consists of 22 lines and is capable of addressing one of $64^2$K 144-bit cells of main memory. However, since the minimum area to be replaced is four columns consisting of 1,048 bit cells, the address to the index 50 of each replacement unit 29 need only be 12-bits wide.

It will be assumed for purposes of explanation that the ECC system can correct up to two random errors or a burst error up to three consecutive bit positions without any miscorrections where the 144 bit positions of the data word include 128 data bit positions and 16 ECC check bit positions. It will be assumed that the type of failure which is most frequent is where one column of one chip fails, as shown in FIG. 3b. There may, therefore, be a number of chips having 1,024 defective bit cells whose addresses are contiguous and make up one fault area that may be replaced. The second most frequent error type is where one entire chip is defective, as shown in FIG. 3a, and the entire chip must be replaced.

Under the above assumptions, a defect of only one bit cell would generally not be replaced since the system would rely on the ECC system to correct the 1-bit of data from that defective cell when it was erroneous. However, if it were to be replaced for some valid technical reason, the entire group of four columns encompassing the one defective cell would be replaced in the embodiment being described.

In summary, the main function of the selection control 36 and, more particularly, the index 50 is to map address data on bus 20 to address and mode control signals for the alternate storage units 31 and 32 and the multiplexers 33 and 34. The manner in which this is achieved will now be described in connection with FIG. 5.

The hardware shown in FIG. 5 comprises four decode blocks 40A–40D which function to decode n inputs from index 50 to $n^2$ outputs. Also shown in FIG. 5 are diagrammatic representations of the input multiplexers 33, four separate spare chips 61–64 of storage unit 31, and the read selector/output multiplexer 34. Storage unit 32 is not shown in FIG. 4.

As shown in FIG. 5, a 16-bit address bus is supplied to each chip of the alternate memory unit 31. The chips 61–64 each have 64K individual addressable storage cells. The 16-bit address is developed from 14 bits of the main memory address and 2 bits of field E from index 50.

The relationship of the various addresses associated with address bus 20 will now be described. It will be recalled that the 22-bit address for the main memory consists of 6 bits for selecting one of 64 separate chips associated with each bit position of a data word. In addition, 8 bits are used to select one of 256 columns on the selected chip, while the remaining 8 bits are used to select one of 256 rows on the selected chip, thus resulting in the definition of a 1-bit cell in the segment of memory associated with 1 bit position of the word. Each of the remaining bit positions of the word have similar chip organizations.

The 12-bit address supplied to the index as field B and field C comprises the same 6 bits employed by main memory for selecting one of 64 chips (field C), and 6 of the 8 bits (field B) which were employed to define one of 256 columns. The 6 bits of the 8-bit column address, therefore, defines one of 64 groups of 4 columns. Each group of 4 columns represents 1,024 storage cells in main memory. Index 50 has 4,096 addressable locations, as shown in FIG. 6. There are 64 groups of locations with each group corresponding to one of the 64 chips associated with one bit position of the data word. Each group, therefore, comprises 64 separate addresses defined by 6 of the 8 column bits. If one column of a chip is defective, 256 bit cells are defective, but the entire group of four columns associated with the one defective column will be replaced. In other words, when main memory is addressed, one of 64 chips will be defined by 6 bits from the address bus, for example, chip 21. These same 6 bits, when applied to index 50 as field C, will select one of 64 address groups, for example, address group 21. Group 21 has 64 storage locations. The high order 6 bits, field B, corresponding to the 8-bit column address from main memory selects which one of the 64 storage locations in address group 21 that is to be read. Sixteen bits of data stored at that index location are read out as fields E–K, as shown in FIG. 5. Field E, consisting of 2 bits, is combined with 14 bits from the address bus 20 to make up the 16-bit address supplied to spare chips 61–64 of alternate memory 31. This 16-bit spare chip address defines the bit cell in the selected spare chip that will be substituted for the addressed bit cell in main memory.

By permitting 2 bits of the spare chip address to be supplied from the index 50 which, in turn, is supplied from the CPU a high degree of flexibility is thus permitted in the mapping process which permits spares having defects to be used and a reasonably small sized index. As shown, the index is 1/256 the size of main memory.

The write multiplexer 33, as shown, has the ability to route one input line of the data bus 14 to any one of the 4 spare memory chips 61–64 in response to the output of decoder 40A. Normally, input line 25 is routed to spare 61, input line 26 to spare 62, input line 27 to spare 63, and input line 28 to spare 64. Decode A functions to take the F field output of 2 bits from index 50 and provide four outputs to multiplexer 33. The normal routing of one input line to its associated spare chip may be changed so that a bit position effectively has a maximum of 256K (4×64K) spare cells that can be used. This is accomplished through multiplexer 33 which functions to connect an input bus line selectively to any one of 4 chips.

Multiplexer 33 includes a second set of switches (not shown) associated with spares 1-4 of alternate storage unit 32 (also not shown). These switches are responsive to the output of decode 40B which decodes field G of 2 bits into 4 output lines in a manner identical to that just described. The spare chips 61-64 of units 31 and 32 also have a read/write control line which may be part of the address bus 20. The function of the control line labelled field D is, as the name implies, to control the read and write operation of the spares of the two alternate memory units 31 and 32.

Decode 40C has a 2-line input from the H field and a 1-line input from field J. The field J input is a format input which determines if decode 40C is to pick one of the four spares 61-64 or whether all four spares will be activated as a group. Field I to decode 40D provides a similar function relative to the alternate storage unit 32.

The function of field K is to provide a further control on each alternate memory unit 31 and 32. One line of field K controls whether unit 31 is active, while the other line controls whether unit 32 is active. All four possible permutations are possible in that neither memory unit 31 or 32 could be selected, both memory units could be selected, or either one of the memory units could be selected. Because of the various levels of control provided by the fields, the system is quite flexible in the assignment of spare cells.

The read operation of the alternate memory 31 is quite similar to the write operation except for one further aspect involving the selective connection of either the main memory or the spare memory to the output bus through the output multiplexer/ read selector 34. The additional control requirement during a read operation stems from the fact that on a write operation, no harm is done if data is supplied to an addressed defective location in main memory at the same time as it is supplied to the spare memory. However, during read, it is necessary to insure that only one memory supplies data. The read select switches 70A-70D are employed as shown. Read selector switch 70C is connected to supply data to position 27 from spare 63 of alternate memory 31, which was supplied from input position 27. The output of decoder 40C controls switches 70, while the output of decoder 40A performs the output routing function of switches 71 and 71' in a manner similar to the routing function provided on the input bus 14.

The operation of the system will now be explained. Assume that a diagnostic check was made of each of the word addresses in main memory and that at each word address, each of the defective cells was identified. For purposes of explanation it will be assumed that the main memory is in the matrix array as shown in FIG. 1a with 64 separate chips for each of the 144 bit positions of the word and that only those chips in rows 1-4 may have defects. Stated differently, it will be assumed that word addresses between 0 and 256K (4×64K) may contain some defective cell positions, but that addresses above 256K contain no defects. The following discussion will, therefore, be limited to treatment of identified faults in any bit positions of the first four rows of chips and a chip position convention will be employed using row and column designations. For example, chip 1-1 is in the first row, first bit column or bit position. Chip 2-119 is in the second row and is assigned to bit position 119 of the data word. The example is directed to a situation where the following chips have been identified as being totally defective by the diagnostic program that is run in the host CPU: 1-13; 1-14; 1-78; 1-122; 2-15; 2-79; 3-16; 4-16; 4-19; 4-20.

Under these circumstances, it will be seen that each of the first 64K addressed word storage locations has a defect in bit positions 13, 14, 78 and 122. A data word that has been stored in any of these locations and subsequently read out would have a high probability of not being correctable by the error correcting system since, as previously discussed, the ECC system can only correct up to two random 1-bit errors or a burst error of up to three consecutive bit positions. While errors are data dependent and some words could be corrected, depending on the binary value of the data in the defect position, the system must be capable of operating with all data values. An analysis of the error conditions identified as a result of the diagnostic check on the memory indicates first that some type of replacement action must be invoked to insure that any data word stored in the first 64K word locations will at least be correctable by the ECC system. Several obvious options are possible and the optimal choice in a practical situation would be effected by the error situations in the rest of the memory since it will be recalled that the alternate memories 31 and 32 have, effectively, a maximum of 8 chips which act as spares or replacements for each group of four input bus lines.

Under the assumed example, five of the eight chips belonging to the replacement section of group 4 could be assigned to replacement chips 1-13, 1-14, 2-15, 3-16 and 4-16. If, however, any of the 63 other chips in each column 13, 14, 15 and 16 needed to be replaced, either in their entirety or a 1,048 cell section, this would have to be taken into consideration when making the final assignment. It will be assumed, however, that this system has decided initially to replace all chips. The appropriate data is transferred to selection control unit 36 of each section 29 in the following manner.

The mapping process required by index 50 must accomplish the following each time the first row of chips in main memory is addressed. Input bus lines 13 and 14, which are assigned to replacement section 4, must be switched to spare 1 of alternate memory 1 and spare 1 of alternate memory 2 respectively. Input line 78 assigned to replacement section 20 must be connected to spare 1 of alternate memory 1 of section 20. Input line 122 of replacement section 31 must be connected to spare 1 of alternate memory 1 of section 31.

The first 64 addressable locations of the index 50 of each replacement section are assigned to the first row of chips. Since the entire chip is to be replaced, all 64 locations of index 50 for section 4 will contain the same data reflecting the necessary control signals to be supplied to multiplexers 33 and 34 and alternate memories 31 and 32 to achieve the mapping function. Likewise, all 64 locations of index 50 for section 20 and index 50 of section 31 will be provided with data reflecting the necessary field control signals to achieve the required mapping functions for these defective areas in main memory. The corresponding 64 addressed locations of the indices 50 associated with the other sections are also loaded with appropriate control signals which prevent any replacement action from occurring in their respective alternate memories.

The similar process is followed with respect to the second row of chips in that the various indices associated with the input bus lines 15 and 79 are provided with control signals to insure that spare chips in the respective replacement sections are mapped as replacements for the defective chips in main memory.

A similar process will be followed in transferring data to the various indices which reflect fault conditions in each of the chips in main memory which are of a size less than a complete chip.

As will be apparent to those persons skilled in the art, several different control philosophies are possible. For example, in some situations, it may be preferable to replace as many defective locations in main memory as possible using the alternate storage units. Under such a philosophy, the ECC system would be called on to the minimal extent for correcting errors which arise either on a random basis or are permanently embedded in the system.

At the other extreme, the control philosophy may rely on the ECC system to provide a maximum amount of the error correcting that is required, thereby imposing the minimal amount of spare replacements for defective locations in main memory.

Thirdly, depending upon the particular criteria involved, a control philosophy which results in the largest number of data words being transferred to memory without an uncorrectable error can be determined on a statistical basis depending upon the error patterns and assumptions on the probability of generating random errors.

Because of the extreme flexibility of the mapping process, the range of control strategies results in an improved memory system.

While the invention has been particularly shown and described with reference to a preferred embodiment thereof, it will be understood by those skilled in the art that various other changes in the form and details may be made therein without departing from the spirit and scope of the invention. For example, the various busses may be 18 bits wide so that the 144 bit data word comprises, in effect, 8 subwords. In such an arrangement, the index 50 is smaller and the mapping process is less complex. Also, as shown in FIG. 1, the channel masking unit may be removable from the system and employed only when the main memory system is experiencing a number of permanent failures.

Having thus described our invention, what we claim as new and desire to secure by Letters Patent is:

1. In a data processing system having a central processing unit including a memory input bus and a memory output bus each having K lines for transferring a data word consisting of K bit positions between the CPU and a main memory which comprises a large plurality of memory locations each of which includes K failure independent bit cells with each said location being individually addressable through a memory address bus, and an error correcting system for correcting predetermined types of errors in data words transferred from said main memory, the improvement comprising:
a control system for selectively replacing defective bit cells in said main memory, said control system including:
a plurality (N) of replacement sections, each of which is associated with a different group of (K/N) bit positions of said data word, each said section comprising a separate failure independent memory for each bit position of said group, each said memory element comprising a plurality of individually addressable bit cells;
means for partially addressing said memory element of each said replacement section with a first subset of address signals directly from said main memory address bus, each said replacement section being further characterized by a writable index which includes a plurality of control data storage locations which are individually addressable by a second subset of address signals from said main memory address bus to provide at least a third subset of address signals which when combined with said first subset of address signals comprise the complete address for said memory element, and means for developing control signals for each said writable index based on the distribution of defective bit cells in each data word storage location of said main memory.

2. The system recited in claim 1 in which each said data word comprises 144 bit positions, said memory input bus comprises 144 lines, said memory output bus comprises 144 lines, said memory address bus comprises 22 lines, said relatively large plurality of memory storage locations comprises $64^2$K addressable storage locations, said plurality of replacement sections comprises 36 sections, said group of bit positions associated with each section comprises 4 bit positions of said data word, said plurality of individually addressable bit cells of each said failure independent memory element comprises 64K, said first subset of address signals comprises 16 signals, said plurality of control data storage locations comprises 4K positions, and said second subset of address signals comprises 16 signals.

3. The system recited in claim 1 in which said means for developing control signals for each said writable index includes:
(a) means for identifying each defective bit cell in each of said plurality of memory locations; and
(b) means for analyzing the pattern of defects in said main memory in accordance with a predetermined control strategy which reflects the power of said ECC system; and
said control system further includes means for transferring developed control signals to said writable index of each said replacement section.

4. The system recited in claim 3 in which said means for transferring includes means for addressing each said index with said second subset of address signals to store said developed control signals in each said index at locations which are address related to main memory locations.

5. The system recited in claim 4 in which each said section includes decoding means connected between the output of said index and each said separate memory element.

6. The system recited in claim 5 in which said decoding means is operable to selectively connect at least one of said separate memory elements to at least one line of said memory input bus and said memory output bus to cause a bit cell of said connected element defined by said first subset of address signals to logically replace an identified defective bit cell in said main memory which is associated with a bit position of an addressed data word and the section containing said selectively connected memory element.

7. The system recited in claim 5 in which a portion of the output of said writable index is used as a portion of an address along with said first subset of address signals to address said memory elements.

8. In a data processing system having a central processing unit (CPU), a main memory system (MMS) having a large plurality of individually addressable storage locations each of which comprises K failure independent bit storage cells for storing data words consisting of K bit positions that are processed by said data processing system, and an error correcting system (ECC) for automatically correcting errors of predetermined types in a data word transferred from said MMS to said CPU, the improvement comprising:

a secondary memory system (SMS) connectable between said CPU and said MMS and operable to selectively assign failure independent bit storage cells in said SMS to replace previously identified defective bit cell positions in said MMS, said SMS being characterized by a writable index having a plurality of addressable storage locations each of which has a predetermined relationship to a group of storage locations in said MMS and each of which contains control data to control the assignment of a secondary bit cell for a defective bit cell in said MMS in accordance with (1) said predetermined addressing relationship, (2) the distribution of defective bit cells in said MMS, and (3) the power of said ECC system, in order to minimize the number of secondary bit cells that are assigned and maximize the number of data words transferred to said CPU before an uncorrectable error is encountered.

9. A memory system for storing a plurality of data words each of which includes a plurality of data bit positions and a plurality of check bit positions containing error correcting check bits, an error correcting system associated with said memory system to correct predetermined error types that occur in said data words during readout from said memory by processing said check bits, said memory system comprising:

a main memory having a relatively large number of individually addressable data word storage locations each of which comprises a plurality of failure independent bit cells, predetermined ones of which have been identified as being defective;

a secondary memory having a relatively small number of individually addressable storage locations each of which comprises a plurality of failure independent bit cells;

means for identifying bit cells in said main memory which are defective and control means for logically substituting bit cells in said secondary memory for selected areas in said main memory which contain identified defective bit cells;

said control means being characterized by a writable index comprising a third memory which is addressable with a first subset of signals from said main memory addressing bus to provide a plurality of field control signals, one field of which is combined with a second subset of signals from said main memory address bus to cause the logical substitution of a defective said bit cell in said main memory with a good bit cell in said secondary memory, said field control signals being further operable to reconfigure portions of said secondary memory to permit each bit location of a data word to be assigned to more than one said portion, said system being further characterized by said field control signals reflecting an analysis of the location of each defective cell in said main memory and the power of said error correcting system in order to minimize the logical replacement of defective bit cells and maximize the number of data words which can be transferred from memory before an uncorrectable error is encountered by said error correcting system.

10. In a memory system which has a main memory for storing a relatively large number of data words at individually addressable locations, each of which comprises a plurality of failure independent bit cells for storing a data word along with error correcting check characters, and a secondary memory which has a relatively small number of addressable data word locations, each of which comprises a corresponding plurality of failure independent bit cells, and a writable index having a plurality of addressable storage locations, each of which stores a unique group of control signals, a method of assigning spare bit cells in said secondary memory as replacements for defective bit cells in said main memory, comprising:

addressing each location in main memory to determine defective bit cells;

storing an indication of each defective bit cell in said main memory;

analyzing the defective bit cell distribution for each data word;

developing memory control signals based on said defective bit cell distribution and the error types which are correctable by an associated ECC system;

transferring, prior to storing data in said main memory, said memory control signals to said writable index to store said control signals at locations which have a predetermined addressing relationship to the addresses of main memory; and transferring a data word to said main memory or from said main memory by addressing a location in said main memory while simultaneously addressing said index and said secondary memory with different subsets of address signals employed to address said location in said main memory whereby said control signals stored in said writable index cause the selective replacement of defective bit cells in said main memory with addressed bit cells of said secondary memory to permit storage and retrieval of data words in said memory system with a minimum of errors.

11. The method recited in claim 10 in which said memory control signals transferred to said index result in a minimum number of defective cells being replaced while maximizing the number of data words that are transferred from said main memory before an error is encountered that is uncorrectable by an associated error correcting system.

* * * * *